US012804972B2

(12) United States Patent
Hu

(10) Patent No.: US 12,804,972 B2
(45) Date of Patent: Nov. 17, 2026

(54) SUPER-JUNCTION POWER DEVICE HAVING ADJUSTABLE RESISTORS CONNECTED IN PARALLEL BETWEEN GATES AND SOURCES AND MANUFACTURING METHOD THEREOF

(71) Applicant: CHONGQING ALPHA AND OMEGA SEMICONDUCTOR LIMITED, Chongqing (CN)

(72) Inventor: Wei Hu, Chongqing (CN)

(73) Assignee: CHONGQING ALPHA AND OMEGA SEMICONDUCTOR LIMITED, Chongqing (CN)

( * ) Notice: Subject to any disclaimer, the term of this patent is extended or adjusted under 35 U.S.C. 154(b) by 384 days.

(21) Appl. No.: 18/432,078

(22) Filed: Feb. 5, 2024

(65) Prior Publication Data

US 2024/0178275 A1 May 30, 2024

Related U.S. Application Data

(63) Continuation of application No. PCT/CN2022/109826, filed on Aug. 3, 2022.

(30) Foreign Application Priority Data

Aug. 11, 2021 (CN) ......................... 202110918978.6

(51) Int. Cl.
*H10D 62/10* (2025.01)
*H10D 1/47* (2025.01)
(Continued)

(52) U.S. Cl.
CPC ............. *H10D 62/125* (2025.01); *H10D 1/47* (2025.01); *H10P 14/24* (2026.01); *H10P 30/40* (2026.01); *H10P 50/00* (2026.01); *H10P 50/73* (2026.01)

(58) Field of Classification Search
CPC .. H10D 62/125; H10D 84/209; H10D 84/206; H10D 84/811–817;
(Continued)

(56) References Cited

U.S. PATENT DOCUMENTS

2011/0266593 A1 11/2011 Hsieh
2019/0326277 A1* 10/2019 Feil ........................ H10D 1/692
(Continued)

FOREIGN PATENT DOCUMENTS

CN 101919042 A 12/2010
CN 113035701 A 6/2021
(Continued)

OTHER PUBLICATIONS

International Search Report issued in corresponding International application No. PCT/CN2022/109826, mailed Oct. 11, 2022.
(Continued)

*Primary Examiner* — Cuong B Nguyen
*Assistant Examiner* — Robert Emil Throckmorton

(57) ABSTRACT

A method of manufacturing a super-junction power device having adjustable resistors connected in parallel between a gate and a source; and the super-junction power device obtained by performing the method are provided. The method includes: preparing a unit cell and the adjustable resistors connected in parallel between the gate and the source of the super-junction power device; preparing contact holes; preparing metal wires; and preparing a passivation layer.

9 Claims, 1 Drawing Sheet

(51) Int. Cl.
*H10P 14/24* (2026.01)
*H10P 30/40* (2026.01)
*H10P 50/00* (2026.01)

(58) Field of Classification Search
CPC ........... H10D 1/40–476; H10D 89/911; H10D 84/403–409; H10P 50/73; H10P 30/40; H10P 14/24; H10P 50/00
See application file for complete search history.

(56) References Cited

U.S. PATENT DOCUMENTS

| | | | | |
|---|---|---|---|---|
| 2023/0093383 A1* | 3/2023 | Wang | H10D 30/66 | 257/329 |
| 2023/0198252 A1* | 6/2023 | Mizan | H10D 89/60 | 361/56 |
| 2023/0326962 A1* | 10/2023 | Chi | H10D 30/668 | 257/330 |

FOREIGN PATENT DOCUMENTS

| | | | | |
|---|---|---|---|---|
| CN | 113644116 A | 11/2021 | | |
| WO | WO-2012165649 A1 * | 12/2012 | | H02M 1/08 |

OTHER PUBLICATIONS

Written Opinion of the International Search Authority in corresponding International application No. PCT/CN2022/109826, mailed Oct. 11, 2022.

* cited by examiner

SUPER-JUNCTION POWER DEVICE HAVING ADJUSTABLE RESISTORS CONNECTED IN PARALLEL BETWEEN GATES AND SOURCES AND MANUFACTURING METHOD THEREOF

TECHNICAL FIELD

The present disclosure relates to a field of manufacturing power device semiconductors, and in particular to a super-junction power device having adjustable resistors connected in parallel between gates and sources, and a method of the manufacturing the super-junction power device.

BACKGROUND

Compared to a conventional power device, a super-junction structure is further arranged in a super-junction power device. When a same extent of voltage-withstand is achieved, an on-resistance of the super-junction power device is decreased by 50% to 65%. Therefore, power consumption of the super-junction power device is reduced effectively, and a system efficiency of the super-junction power device is improved. Especially, when the super-junction power device is configured in a high-power power supply product, advantages of performance of the super-junction power device are more prominent.

For the super-junction power device arranged in a circuit, an additional resistor needs to be arranged to be in-parallel connected between a gate and a source. In this way, the super- junction power device being turned on accidentally due to current leakage in the circuit may be avoided. Furthermore, the additional resistor serves as an electrostatic protection structure for the gate to protect the gate from being damaged by an external electrostatic impact. However, by arranging the additional in-parallel connected resistor, costs for circuit design and manufacturing are increased, and resistor failure may be caused by any abnormality occurring while the circuit is being manufactured. In addition, the additional resistor may be in different resistance values based on performance requirements of the circuit, and using the additional resistor having a fixed resistance value may reduce versatility of the circuit. Therefore, the above super-junction power device needs to be improved.

SUMMARY OF THE DISCLOSURE

The present disclosure provides a super-junction power device having adjustable resistors connected in parallel between gates and sources, and a method of manufacturing the super-junction power device.

In a first aspect, the present disclosure provides a method of manufacturing a super-junction power device having adjustable resistors connected in parallel between gates and sources, where the gates and the sources are in one-to-one correspondence with each other, and more than one adjustable resistor are connected in parallel between each of the gates and the corresponding one of the sources, the method including:

- a step A: preparing a unit cell and the adjustable resistors connected in parallel between the source and the gate of the super-junction power device;
- a step B: preparing contact holes;
- a step C: preparing metal wires; and
- a step D: preparing a passivation layer.

In some embodiments, the step A includes:

- a step S1: depositing, by performing chemical vapor deposition, an intrinsic epitaxial layer on an upper surface of a silicon substrate; doping pentavalent elements, by ion implantation, into the intrinsic epitaxial layer;
- a step S2: depositing a first mask on an upper surface of the intrinsic epitaxial layer, where the first mask is photoresist or a multilayer structure of the photoresist combined with at least one insulating mask;
- a step S3: defining, by performing a photolithographic process, a pattern of columnar doping regions on the first mask to form the columnar doping regions; doping, by ion implantation, trivalent elements into the intrinsic epitaxial layer; removing the first mask by dry etching and wet etching;
- a step S4: repeating the step S1, the step S2, and the step S3 until a total thickness of the intrinsic epitaxial layer is in a range of 30 um to 70 um;
- a step S5: growing a gate oxide layer by performing a thermal oxidation step; obtaining a doped gate polysilicon by low-pressure chemical vapor deposition;
- a step S6: depositing a second mask on the gate polysilicon, where the second mask is photoresist or a multilayer structure of the photoresist combining with at least one insulating mask; defining a first gate pattern on the second mask by performing a photolithographic process, forming the gates by dry etching; removing the second mask by dry etching and wet etching; defining a second gate pattern of a field effect transistor of metal oxides of the unit cell and a pattern of the adjustable resistors connected in parallel between the gate and the source, where a resistance value of the adjustable resistor connected in parallel connected between the gate and the source is adjustable within a range from 5 kOhms to 20 kOhms; where an adjustment of the resistance value of the adjustable resistors is achieved by defining the pattern of the adjustable resistors connected in parallel to have a width of 1-10 um, and providing two to five adjustable resistors connected in parallel between one gate and one source;
- a step S7: obtaining body regions by implanting first impurities into the upper surface of the intrinsic epitaxial layer, where the first impurities include trivalent elements; implanting the first impurities into the polysilicon; activating the trivalent-element impurities in the body regions by performing a thermal process;
- a step S8: depositing a third mask on the upper surface of the intrinsic epitaxial layer, where the third mask is photoresist or a multilayer structure of the photoresist combining with at least one insulating mask; defining a pattern of source regions on the third mask by performing a photolithography process; obtaining the source regions by implanting second impurities into an upper surface of each of the body regions; where the second impurities include the pentavalent elements; blocking, by the third mask, a polysilicon resistor from being doped by the second impurities; removing the third mask by dry etching and wet etching; activating the second impurities in the source regions by performing a thermal process; and
- a step S9: obtaining highly-doped ohmic contact regions by implanting the trivalent elements to the upper surface of the intrinsic epitaxial layer; implanting the trivalent elements into the polysilicon resistor to obtain the unit cell and the adjustable resistors connected in parallel between the gate and the source.

In some embodiments, the trivalent elements the step S3, the step S7, and the step S9 include boron; and the pentavalent elements in the step S1, and the step S8 are selected from arsenic and phosphorus.

In some embodiments, processing conditions of implanting the trivalent elements and the pentavalent elements are independently defined for each repetition of the steps S1-S3 in the step S4, until the total thickness of the intrinsic epitaxial layer reaches the range of 30 um to 70 um.

In some embodiments, a thickness of the gate oxide layer in the step S5 is in a range of 50 nm to 200 nm, and a thickness of the gate polysilicon in the step S5 is in a range of 500 nm to 1000 nm.

In some embodiments, the step B includes:

a step S10: forming a silicon dioxide dielectric layer by chemical vapor deposition;

a step S11: defining a pattern of contact holes of the source regions, a pattern of a contact hole of a gate region, a pattern of gate contact holes and a pattern of source contact holes of the adjustable resistors connected in parallel between the gate and the source;

where the pattern of the contact holes of the source regions is located above the source regions and the body regions and is configured to lead out both the source regions and the body regions; the patter of the contact hole of the gate region is located above the gate polysilicon; a gate metal wire is arranged in a partial region of the source regions without the contact holes of the source regions; the gate contact holes and the source contact holes of the adjustable resistors connected in parallel between the gate and the source are located above the adjustable resistors connected in parallel between the gate and the source and are configured to allow the gate and the source to be in-parallel connected to the adjustable resistors;

a step S12: obtaining the contact holes of the source regions, the contact hole of the gate region, and the gate contact holes and the source contact holes of the adjustable resistors connected in parallel between the gate and the source by dry etching the silicon dioxide dielectric layer;

a step S13: depositing, by performing physical vapor deposition, a metal layer to serve as an adhesive layer; depositing, by performing physical vapor deposition, metal nitride to serve as a barrier layer; forming silicide by performing a rapid thermal degradation process, where the metal includes one or more of: titanium, cobalt, and tantalum; and a step S14: depositing, by performing a tungsten bolt process, tungsten metal; removing, by performing dry etching, any tungsten metal located outside the contact holes to form the tungsten bolt in each of the contact holes of the source regions, the contact hole of the gate region, and each of the contact holes of the adjustable resistors connected in parallel between the gate and the source.

In some embodiments, the step C includes:

a step S15: depositing, by performing physical vapor deposition, an aluminum-copper compound above the tungsten bolt; defining, by performing a photolithography process and using the photoresist, a metal wire pattern of the source, a metal wire gate pattern, a pattern of control electrodes of the adjustable resistors connected in parallel between the gate and the source; obtaining, by performing dry etching, the source, the gate, and the control electrodes of the adjustable resistors connected in parallel between the gate and the source, where the metal wire pattern of the source is located above the source regions; arranging the metal wire gate pattern to surround an edge of the unit cell to connect the gate, through the contact hole of the gate region, to the partial region of the source regions without the contact holes of the source regions to form the gate metal wire. The pattern of the control electrodes of the adjustable resistors connected in parallel between the gate and the source is connected, through the gate contact hole, to each of the independent adjustable resistors connected in parallel between the gate and the source; one control electrode is led out from a region between the gate metal wire and one adjustable resistor connected in parallel between the gate and the source; the number of control electrodes is equal to the number of the in-parallel connected adjustable resistors.

In some embodiments, in the step S15, a post-intersection metal wire is formed after a metal wire of the gate contact hole of the adjustable resistor intersects a metal wire of the control electrode of the independent adjustable resistor, the post-intersection metal wire is configured to connect with the gate metal wire, the pattern of the control electrode of the adjustable resistors connected in parallel between the gate and the source is configured to enable the post-intersection metal wire to have a width in a range of 1 um to 2 um.

In some embodiments, the step D includes:

a step S16: depositing a passivation layer, defining, by performing a photolithography process and using the photoresist, a metal contact region of the source, a metal contact region of the gate, and contact regions of the control electrodes of the adjustable resistors connected in parallel between the gate and the source; and obtaining, by performing dry etching, the metal contact region of the source, the metal contact region of the gate, and the contact regions of the control electrodes of the adjustable resistors connected in parallel between the gate and the source. The number of the contact regions of the control electrodes is equal to the number of adjustable resistors connected in parallel between the gate and the source, and the contact regions of the control electrodes and the adjustable resistors connected in parallel between the gate and the source are in one-to-one correspondence with each other; and the passivation layer is silicon nitride or silicon dioxide.

In a second aspect, the present disclosure provides the super-junction power device having adjustable resistors connected in parallel between the gate and the source, obtained by performing the manufacturing method as described in the above.

According to the present disclosure, following technical effects can be achieved.

(1) The external resistors, which need to be connected in parallel between the gate and the source, are now replaced with the adjustable resistors integrated into the super-junction power device. In this way, the extent of integration and stability of the super-junction power device is improved, complexity of designing the circuit is simplified, the cost of designing and manufacturing the circuit is reduced.

(2) By arranging each of the resistor control electrodes for controlling a corresponding adjustable resistor between the gate and the source, on-circuit control is performed on the adjustable resistors connected in parallel between the gate and the source, such that the resistance value of each of the adjustable resistors between the gate and the source is adjusted, the super-junction power device can be applied widely.

(3) Since each of the resistor control electrodes controls a corresponding adjustable resistor between the gate and the source and performs the on-circuit control on the adjustable resistors connected in parallel between the gate and the source to adjust the resistance value of each of the adjustable resistors between the gate and the source, changes in the gate pattern, the pattern of the contact holes, and the pattern of the metal wire layer, and re-making masks, caused by the adjustable resistors connected in parallel between different gates and sources having different application requirements, may be avoided. Therefore, manufacturing costs can be reduced, and versatility of the super-junction power device can be improved.

Figure 1:
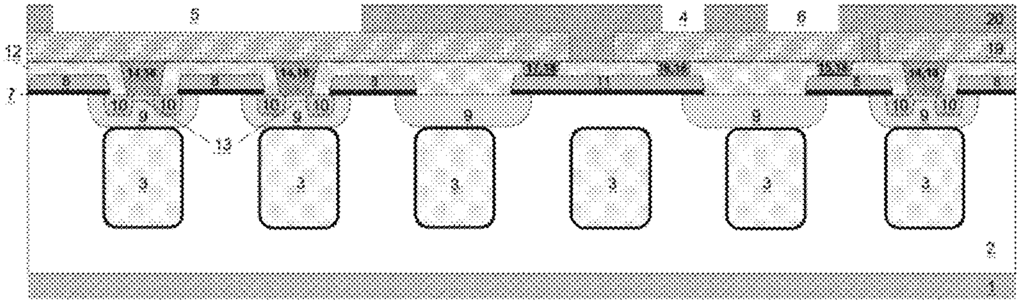
FIG. 1 is a structural schematic view of a super-junction power device having adjustable resistors connected in parallel between a gate and a source, according to one embodiment of the present disclosure.

In the drawings: 1, silicon substrate; 2, intrinsic epitaxial layer; 3, columnar doped regions; 4, control electrodes of adjustable resistors; 5, source; 6, gate; 7, gate oxide layer; 8, gate polysilicon; 9, body regions; 10, source regions; 11, in-parallel connected adjustable resistors; 12, silicon dioxide dielectric layer; 13, ohmic contact regions; 14, body region/source region contact holes; 15, contact hole of the gate region; 16, gate contact holes; 17, source contact holes; 18, tungsten bolts; 19, aluminum-copper compound; 20, passivation layer; 21, gate metal wires.

DETAILED DESCRIPTION

Technical solutions in the embodiments of the present disclosure will be clearly and completely described below by referring to the accompanying drawings in the embodiments of the present disclosure. Apparently, the described embodiments are only a part of but not all of the embodiments of the present disclosure. All other embodiments, which are obtained by any ordinary skilled person in the art based on the embodiments of the present disclosure without making creative work, shall fall within the scope of the present disclosure.

Embodiment 1

Figure 2:
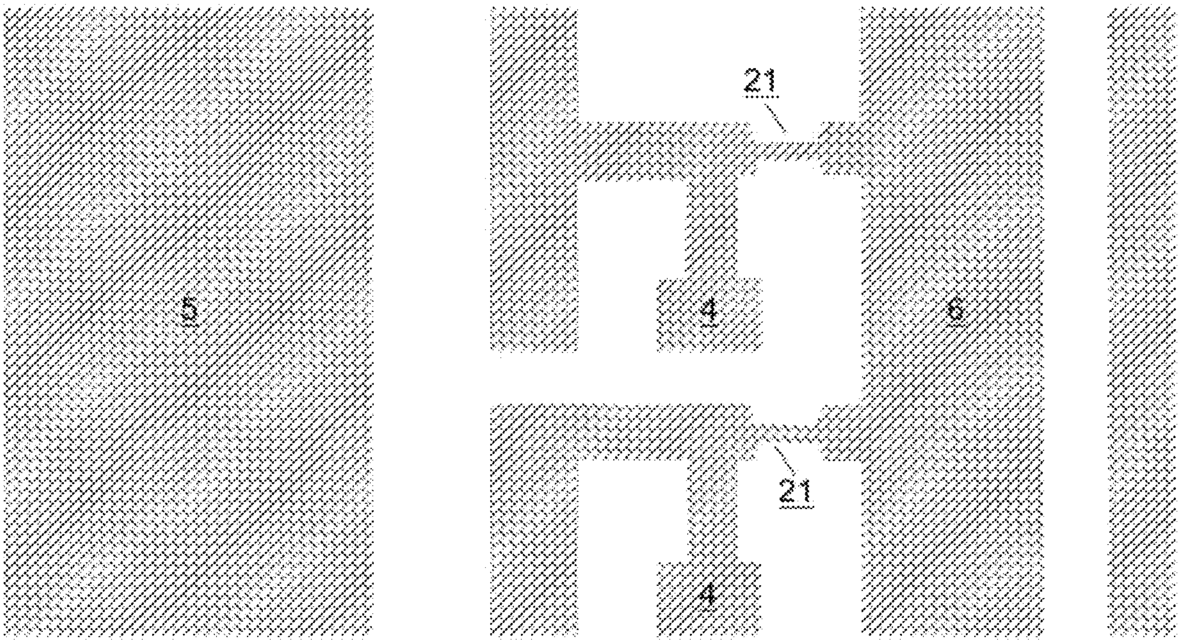
FIG. 2 is a cross sectional view of metal wires of the gate of the super-junction power device having the adjustable resistors connected in parallel between the gate and the source, according to one embodiment of the present disclosure.

As shown in FIG. 1 and FIG. 2, the present embodiment provides a method of manufacturing a super-junction power device having adjustable resistors connected in parallel between a gate and a source. The method includes following steps.

In a step S1, an intrinsic epitaxial layer 2 is deposited, by performing chemical vapor deposition, on an upper surface of a silicon substrate 1; pentavalent elements are doped, by ion implantation, into the intrinsic epitaxial layer 2; the pentavalent elements are selected from arsenic and phosphorus. In the present embodiment, the arsenic is used as the pentavalent element.

In a step S2, a first mask is deposited on an upper surface of the intrinsic epitaxial layer 2. The first mask is photoresist or a multilayer structure of the photoresist combined with at least one insulating mask.

In a step S3, a pattern of columnar doping regions is defined, by performing a photolithographic process, in the first mask to form the columnar doping regions 3; the trivalent element is doped, by ion implantation, into the intrinsic epitaxial layer 2; the first mask is removed by dry etching and wet etching. The trivalent element is boron.

In a step S4, the steps S1-S3 are repeatedly performed until a total thickness of the intrinsic epitaxial layer 2 is 50 um. In the step S4, for each repetition of the steps S1-S3, processing conditions of implanting the trivalent elements and the pentavalent elements are individually defined based on device design requirements.

In a step S5, a gate oxide layer 7 is growing by performing a thermal oxidation method; and doped gate polysilicon 8 is deposited by low-pressure chemical vapor deposition. A thickness of the gate oxide layer 7 is 80 nm, and a thickness of the gate polysilicon 8 is 700 nm.

In a step S6, a second mask is deposited on the gate polysilicon 8. The second mask is photoresist or a multilayer structure of the photoresist combining with at least one insulating mask. A first gate pattern is defined on the second mask by performing a photolithographic process, and a gate 6 is formed based on the gate pattern by dry etching. The second mask is removed by dry etching and wet etching.

A second gate pattern of a field effect transistor of metal oxides of a unit cell is defined, and a pattern of adjustable resistors 11 connected in parallel between the gate 6 and the source 5 is defined. A resistance value of the adjustable resistors 11 connected in parallel between the gate 6 and the source 5 is adjustable within a range from 7 kOhms to 20 kOhms. Adjustment of the resistance value is achieved by defining the pattern of the adjustable resistors connected in parallel to have a width of 5 um, and providing three adjustable resistors connected in parallel between one gate and one source.

In a step S7, body regions 9 are obtained by implanting first impurities into the upper surface of the intrinsic epitaxial layer 2. The first impurities include trivalent elements, and the trivalent elements include boron. Further, the first impurities are implanted into the polysilicon. The trivalent-element impurities in the body regions 9 are activated by performing the thermal process.

In a step S8, a third mask is deposited on the upper surface of the intrinsic epitaxial layer 2. The third mask is a photoresist or a multilayer structure of the photoresist combining with at least one insulating mask. A pattern of source regions 10 is defined on the third mask by performing the photolithography process. The source regions 10 are obtained by implanting second impurities into an upper surface of each of the body regions 9. The second impurities include pentavalent elements, and the pentavalent elements are selected from arsenic and phosphorus. In the present embodiment, the arsenic is used as the pentavalent element. Further, the third mask blocks a polysilicon resistor region, such that second impurities are prevented from being implanted into the polysilicon resistor region. The third mask is removed by dry etching and wet etching, and the second impurities in the source regions 10 are activated by performing the thermal process.

In a step S9, highly-doped ohmic contact region 13 are obtained by implanting the trivalent element boron to the upper surface of the intrinsic epitaxial layer 2. The trivalent elements are further implanted into the polysilicon resistor region. Lastly, the adjustable resistors 11 connected in parallel between the gate 6 and the source 5 is obtained.

In a step S10, a silicon dioxide dielectric layer 12 is formed by chemical vapor deposition.

In a step S11, a pattern of contact holes 14 of the source region, a pattern of a contact hole 15 of the gate region, a pattern of gate contact holes 16 and a pattern of source contact holes 17 of the adjustable resistors 11 connected in parallel between the gate 6 and the source 5 are defined by performing the photolithography process and using the photoresist. The pattern of the contact holes 14 of the source regions is located above the source regions 10 and the body regions 9 and is configured to lead out both the source regions 10 and the body regions 9. The patter of the contact hole 15 of the gate region is located above the gate polysilicon 8. Gate metal wires 21 are arranged in a partial region of the source regions 10 without the contact holes 14 of the source regions. The gate contact holes 16 and the source contact holes 17 of the adjustable resistors 11 connected in parallel between the gate 6 and the source 5 are located above the adjustable resistors 11 connected in parallel between the gate 6 and the source 5 and are configured to allow the gate 6 and the source 5 to be in-parallel connected to the adjustable resistors 11.

In a step S12, the contact holes 14 of the source regions, the contact holes 15 of the gate region, and the gate contact holes 16 and the source contact holes 17 of the adjustable resistors 11 connected in parallel between the gate 6 and the source 5 are obtained by dry etching the silicon dioxide dielectric layer 12.

In a step S13, a metal layer is deposited, by performing physical vapor deposition, to serve as an adhesive layer; metal nitride is deposited, by performing physical vapor deposition, to serve as a barrier layer; and silicide is formed by performing a rapid thermal degradation process. The metal includes one or more of: titanium, cobalt, and tantalum. In the present embodiment, the titanium is used as the metal.

In a step S14, the tungsten metal is deposited by performing a tungsten bolt process. Any tungsten located outside the contact holes is removed by performing dry etching. The tungsten bolt 18 is formed in each of the contact holes 14 of the source regions, the contact hole 15 of the gate region, and each of the contact holes of the adjustable resistors 11 connected in parallel between the gate 6 and the source 5.

In a step S15, an aluminum-copper compound 19 is deposited above the tungsten bolt 18 by performing physical vapor deposition. A metal wire pattern of the source 5, a metal wire gate pattern, a pattern of control electrodes of the adjustable resistances 11 connected in parallel between the gate 6 and the source 5 are defined by performing the photolithography process and using the photoresist. The source 5, the gate 6, and the control electrodes 4 of the adjustable resistors connected in parallel between the source 5 and the gate 6 are obtained by performing dry etching.

The metal wire pattern of the source 5 is located above the source regions 10. The metal wire gate pattern is arranged to surround an edge of the unit cell to connect the gate 6, through the contact hole 15 of the gate region, to the partial region of the source regions without the contact hole of the source regions to form the gate metal wires 21.

The pattern of the control electrodes 4 of the adjustable resistors connected in parallel between the gate 6 and the source 5 is connected, through each of the gate contact holes 16, to the respective independent adjustable resistor 11 connected in parallel between the gate 6 and the source 5. In addition, one control electrode 4 is led out from a region between the gate metal wires 21 and one independent adjustable resistor 11 connected between the gate and the source. The number of control electrodes 4 is equal to the number of the in-parallel connected adjustable resistors 11, and the control electrodes 4 and the adjustable resistors 11 are in one-to-one correspondence to each other.

In the step S15, for each of the adjustable resistors connected in parallel between the gate and the source, a post-intersection metal wire is formed after a metal wire of the gate contact hole of the adjustable resistor intersects a metal wire of the control electrode of the adjustable resistor, the post-intersection metal wire is configured to connect with the gate metal wire, the pattern of the control electrodes 4 of the adjustable resistors connected in parallel between the gate and the source is configured to enable the post-intersection metal wire to have a width in a range of 1.5 um.

In a step S16, a passivation layer 20 is deposited; and a metal contact region of the source 5, a metal contact region of the gate 6, and contact regions of the control electrodes 4 of the adjustable resistors connected in parallel between the gate 6 and the source 5 are defined by performing the photolithography process and using the photoresist.

The metal contact region of the source 5, the metal contact region of the gate 6, and the contact regions of the control electrodes 4 of the adjustable resistors connected in parallel between the gate 6 and the source 5 are obtained by performing dry etching. The number of contact regions of the control electrodes 4 is equal to the number of adjustable resistors 11 connected in parallel between the gate 6 and the source 5; and the contact regions of the control electrodes 4 and the adjustable resistors 11 are in one-to-one correspondence with each other. The passivation layer 20 is silicon nitride.

Lastly, a super-junction power device having the adjustable resistors connected in parallel between the gate and the source is obtained.

Embodiment 2

As shown in FIG. 1 and FIG. 2, the present embodiment provides a method of manufacturing the super-junction power device having the adjustable resistors connected in parallel between the gate and the source. The method includes following steps.

In a step S1, an intrinsic epitaxial layer 2 is deposited, by performing chemical vapor deposition, on an upper surface of a silicon substrate 1; pentavalent elements are doped, by ion implantation, into the intrinsic epitaxial layer 2; the pentavalent elements are selected from arsenic and phosphorus. In the present embodiment, the phosphorus is used as the pentavalent element.

In a step S2, a first mask is deposited on an upper surface of the intrinsic epitaxial layer 2. The first mask is photoresist or a multilayer structure of the photoresist combined with at least one insulating mask.

In a step S3, a pattern of columnar doping regions is defined, by performing a photolithographic process, in the first mask to form the columnar doping regions 3; the trivalent element is doped, by ion implantation, into the intrinsic epitaxial layer 2; the first mask is removed by dry etching and wet etching. The trivalent element is boron.

In a step S4, the steps S1-S3 are repeatedly performed until a total thickness of the intrinsic epitaxial layer 2 is 60 um. In the step S4, for each repetition of the steps S1-S3, processing conditions of implanting the trivalent elements and the pentavalent elements are individually defined based on device design requirements.

In a step S5, a gate oxide layer 7 is growing by performing a thermal oxidation method; and doped gate polysilicon 8 is deposited by low-pressure chemical vapor deposition. A thickness of the gate oxide layer 7 is 100 nm, and a thickness of the gate polysilicon 8 is 600 nm.

In a step S6, a second mask is deposited on the gate polysilicon 8. The second mask is photoresist or a multilayer structure of the photoresist combining with at least one insulating mask. A first gate pattern is defined on the second mask by performing a photolithographic process, and a gate 6 is formed based on the gate pattern by dry etching. The second mask is removed by dry etching and wet etching.

A second gate pattern of a field effect transistor of metal oxides of a unit cell is defined, and a pattern of adjustable resistors 11 connected in parallel between the gate 6 and the source 5 is defined. A resistance value of the adjustable resistors 11 connected in parallel between the gate 6 and the source 5 is adjustable within a range from 7 kOhms to 10 kOhms. Adjustment of the resistance value is achieved by defining the pattern of the adjustable resistors connected in parallel to have a width of 3 um, and providing three adjustable resistors connected in parallel between one gate and one source.

In a step S7, body regions 9 are obtained by implanting first impurities into the upper surface of the intrinsic epitaxial layer 2. The first impurities include trivalent elements, and the trivalent elements include boron. Further, the first impurities are implanted into the polysilicon. The trivalent-element impurities in the body regions 9 are activated by performing the thermal process.

In a step S8, a third mask is deposited on the upper surface of the intrinsic epitaxial layer 2. The third mask is a photoresist or a multilayer structure of the photoresist combining with at least one insulating mask. A pattern of source regions 10 is defined on the third mask by performing the photolithography process. The source regions 10 is obtained by implanting second impurities into an upper surface of each of the body regions 9. The second impurities include pentavalent elements, and the pentavalent elements are selected from arsenic and phosphorus. In the present embodiment, the phosphorus is used as the pentavalent element. Further, the third mask blocks a polysilicon resistor region, such that the second impurities are prevented from being implanted into the polysilicon resistor region. The third mask is removed by dry etching and wet etching, and the second impurities in the source regions 10 are activated by performing the thermal process.

In a step S9, highly-doped ohmic contact regions 13 are obtained by implanting the trivalent element boron to the upper surface of the intrinsic epitaxial layer 2. The trivalent elements are further implanted into the polysilicon resistor region. Lastly, the adjustable resistors 11 connected in parallel between the gate 6 and the source 5 is obtained.

In a step S10, the silicon dioxide dielectric layer 12 is formed by chemical vapor deposition.

In a step S11, a pattern of contact holes 14 of the source regions, a pattern of a contact hole 15 of the gate region, a pattern of gate contact holes 16 and a pattern of source contact holes 17 of the adjustable resistors 11 connected in parallel between the gate 6 and the source 5 are defined by performing the photolithography process and using the photoresist. The pattern of the contact holes 14 of the source regions is located above the source regions 10 and the body regions 9 and is configured to lead out both the source regions 10 and the body regions 9. The patter of the contact hole 15 of the gate region is located above the gate polysilicon 8. Gate metal wires 21 are arranged in a partial region of the source regions 10 without the contact holes 14 of the source regions. The gate contact holes 16 and the source contact holes 17 of the adjustable resistors 11 connected in parallel between the gate 6 and the source 5 are located above the adjustable resistors 11 connected in parallel between the gate 6 and the source 5 and are configured to allow the gate 6 and the source 5 to be in-parallel connected to the adjustable resistors 11.

In a step S12, the contact holes 14 of the source regions, the contact holes 15 of the gate region, and the gate contact holes 16 and the source contact holes 17 of the adjustable resistors 11 connected in parallel between the gate 6 and the source 5 are obtained by dry etching the silicon dioxide dielectric layer 12.

In a step S13, a metal layer is deposited, by performing physical vapor deposition, to serve as an adhesive layer; metal nitride is deposited, by performing physical vapor deposition, to serve as a barrier layer; and silicide is formed by performing a rapid thermal degradation process. The metal includes one or more of: titanium, cobalt, and tantalum. In the present embodiment, the cobalt is used as the metal.

In a step S14, the tungsten metal is deposited by performing a tungsten bolt process. Any tungsten located outside the contact holes is removed by performing dry etching. The tungsten bolt 18 is formed in each of the contact holes 14 of the source regions, the contact hole 15 of the gate region, and each of the contact holes of the adjustable resistors 11 connected in parallel between the gate 6 and the source 5.

In a step S15, an aluminum-copper compound 19 is deposited above the tungsten bolt 18 by performing physical vapor deposition. A metal wire pattern of the source 5, a metal wire gate pattern, a pattern of control electrodes of the adjustable resistances 11 connected in parallel between the gate 6 and the source 5 are defined by performing the photolithography process and using the photoresist. The source 5, the gate 6, and the control electrodes 4 of the adjustable resistors connected in parallel between the source 5 and the gate 6 are obtained by performing dry etching.

The metal wire pattern of the source 5 is located above the source regions 10.

The metal wire gate pattern is arranged to surround an edge of the unit cell to connect the gate 6, through the contact hole 15 of the gate region, to the partial region in the source regions without the contact hole of the source regions to form the gate metal wires 21.

The pattern of the control electrodes 4 of the adjustable resistors connected in parallel between the gate 6 and the source 5 is connected, through each of the gate contact holes 16, to the respective independent adjustable resistor 11 connected in parallel between the gate 6 and the source 5. In addition, one control electrode 4 is led out from a region between the gate metal wires 21 and one independent adjustable resistor 11 connected between the gate and the source. The number of control electrodes 4 is equal to the number of the in-parallel connected adjustable resistors 11, and the control electrodes 4 and the adjustable resistors 11 are in one-to-one correspondence to each other.

In the step S15, for each of the adjustable resistors connected in parallel between the gate and the source, a post-intersection metal wire is formed after a metal wire of the gate contact hole of the adjustable resistor intersects a metal wire of the control electrode of the adjustable resistor, the post-intersection metal wire is configured to connect with the gate metal wire, the pattern of the control electrodes 4 of the adjustable resistors connected in parallel between the gate and the source is configured to enable the post-intersection metal wire to have a width in a range of 1 um.

In a step S16, a passivation layer 20 is deposited; and a metal contact region of the source 5, a metal contact region of the gate 6, and contact regions of the control electrodes 4 of the adjustable resistors connected in parallel between the gate 6 and the source 5 are defined by performing the photolithography process and using the photoresist.

The metal contact region of the source 5, the metal contact region of the gate 6, and the contact regions of the control electrodes 4 of the adjustable resistors connected in parallel between the gate 6 and the source 5 are obtained by performing dry etching. The number of contact regions of the control electrodes 4 is equal to the number of adjustable resistors 11 connected in parallel between the gate 6 and the source 5; and the contact regions of the control electrodes 4 and the adjustable resistors 11 are in one-to-one correspondence with each other. The passivation layer 20 is silicon nitride.

Lastly, a super-junction power device having the adjustable resistors connected in parallel between the gate and the source is obtained.

Embodiment 3

As shown in FIG. 1 and FIG. 2, the present embodiment provides a method of manufacturing the super-junction power device having the adjustable resistors connected in parallel between the gate and the source. The method includes following steps.

In a step S1, an intrinsic epitaxial layer 2 is deposited, by performing chemical vapor deposition, on an upper surface of a silicon substrate 1; trivalent elements are doped, by ion implantation, into the intrinsic epitaxial layer 2. In the present embodiment, the trivalent elements are boron elements.

In a step S2, a first mask is deposited on an upper surface of the intrinsic epitaxial layer 2. The first mask is photoresist or a multilayer structure of the photoresist combined with at least one insulating mask.

In a step S3, a pattern of columnar doping regions is defined, by performing a photolithographic process, in the first mask to form the columnar doping regions 3; the pentavalent element is doped, by ion implantation, into the intrinsic epitaxial layer 2; the first mask is removed by dry etching and wet etching. The pentavalent element is selected from arsenic and phosphorus. In the present embodiment, phosphorus is used as the pentavalent element.

In a step S4, the steps S1-S3 are repeatedly performed until a total thickness of the intrinsic epitaxial layer 2 is 55 um. In the step S4, for each repetition of the steps S1-S3, processing conditions of implanting the trivalent elements and the pentavalent elements are individually defined based on device design requirements.

In a step S5, a gate oxide layer 7 is growing by performing a thermal oxidation method; and doped gate polysilicon 8 is deposited by low-pressure chemical vapor deposition. A thickness of the gate oxide layer 7 is 90 nm, and a thickness of the gate polysilicon 8 is 650 nm.

In a step S6, a second mask is deposited on the gate polysilicon 8. The second mask is photoresist or a multilayer structure of the photoresist combining with at least one insulating mask. A first gate pattern is defined on the second mask by performing a photolithographic process, and a gate 6 is formed based on the gate pattern by dry etching. The second mask is removed by dry etching and wet etching.

A second gate pattern of a field effect transistor of metal oxides of a unit cell is defined, and a pattern of adjustable resistors 11 connected in parallel between the gate 6 and the source 5 is defined. A resistance value of the adjustable resistors 11 connected in parallel between the gate 6 and the source 5 is adjustable within a range from 7 kOhms to 10 kOhms. Adjustment of the resistance value is achieved by defining the pattern of the adjustable resistors connected in parallel to have a width of 7 um, and providing two adjustable resistors connected in parallel between one gate and one source.

In a step S7, body regions 9 are obtained by implanting first impurities into the upper surface of the intrinsic epitaxial layer 2. The first impurities include pentavalent element, and the pentavalent elements are selected from arsenic and phosphorus. In the present embodiment, phosphorus is used as the pentavalent element. Further, the first impurities are implanted into the polysilicon. The pentavalent-element impurities in the body regions 9 are activated by performing the thermal process.

In a step S8, a third mask is deposited on the upper surface of the intrinsic epitaxial layer 2. The third mask is a photoresist or a multilayer structure of the photoresist combining with at least one insulating mask. A pattern of source regions 10 is defined on the third mask by performing the photolithography process. The source regions 10 are obtained by implanting second impurities into an upper surface of each of the body regions 9. In the present embodiment, boron is used as the trivalent element. Further, the third mask blocks a polysilicon resistor region, such that second impurities are prevented from being implanted into the polysilicon resistor region. The third mask is removed by dry etching and wet etching, and the second impurities in the source regions 10 are activated by performing the thermal process.

In a step S9, highly-doped ohmic contact regions 13 are obtained by implanting the pentavalent element to the upper surface of the intrinsic epitaxial layer 2. The pentavalent element is selected from arsenic and phosphorus. The trivalent elements are further implanted into the polysilicon resistor region. Lastly, the adjustable resistors 11 connected in parallel between the gate 6 and the source 5 is obtained.

In a step S10, a silicon dioxide dielectric layer 12 is formed by chemical vapor deposition.

In a step S11, a pattern of contact holes 14 of the source regions, a pattern of a contact hole 15 of the gate region, a pattern of gate contact holes 16 and a pattern of source contact holes 17 of the adjustable resistors 11 connected in parallel between the gate 6 and the source 5 are defined by performing the photolithography process and using the photoresist. The pattern of the contact holes 14 of the source regions is located above the source regions 10 and the body regions 9 and is configured to lead out both the source regions 10 and the body regions 9. The patter of the contact hole 15 of the gate region is located above the gate polysilicon 8. Gate metal wires 21 is arranged in a partial region of the source regions 10 without the contact holes 14 of the source regions. The gate contact holes 16 and the source contact holes 17 of the adjustable resistors 11 connected in parallel between the gate 6 and the source 5 are located above the adjustable resistors 11 connected in parallel between the gate 6 and the source 5 and are configured to allow the gate 6 and the source 5 to be in-parallel connected to the adjustable resistors 11.

In a step S12, the contact holes 14 of the source regions, the contact holes 15 of the gate region, and the gate contact holes 16 and the source contact holes 17 of the adjustable resistors 11 connected in parallel between the gate 6 and the source 5 are obtained by dry etching the silicon dioxide dielectric layer 12.

In a step S13, a metal layer is deposited, by performing physical vapor deposition, to serve as an adhesive layer; metal nitride is deposited, by performing physical vapor deposition, to serve as a barrier layer; and silicide is formed by performing a rapid thermal degradation process. The metal includes one or more of: titanium, cobalt, and tantalum. In the present embodiment, the titanium is used as the metal.

In a step S14, the tungsten metal is deposited by performing a tungsten bolt process. Any tungsten located outside the contact holes is removed by performing dry etching. The tungsten bolt 18 is formed in each of the contact holes 14 of the source regions, the contact hole 15 of the gate region, and each of the contact holes of the adjustable resistors 11 connected in parallel between the gate 6 and the source 5.

In a step S15, an aluminum-copper compound 19 is deposited above the tungsten bolt 18 by performing physical vapor deposition. A metal wire pattern of the source 5, a metal wire gate pattern, a pattern of control electrodes of the adjustable resistances 11 connected in parallel between the gate 6 and the source 5 are defined by performing the photolithography process and using the photoresist. The source 5, the gate 6, and the control electrodes 4 of the adjustable resistors connected in parallel between the source 5 and the gate 6 are obtained by performing dry etching.

The metal wire pattern of the source 5 is located above the source regions 10.

The metal wire gate pattern is arranged to surround an edge of the unit cell to connect the gate 6, through the contact hole 15 of the gate region, to the partial region of the source regions without the contact hole of the source regions to form the gate metal wires 21.

The pattern of the control electrodes 4 of the adjustable resistors connected in parallel between the gate 6 and the source 5 is connected, through each of the gate contact holes 16, to the respective independent adjustable resistor 11 connected in parallel between the gate 6 and the source 5. In addition, one control electrode 4 is led out from a region between the gate metal wires 21 and one independent adjustable resistor 11 connected between the gate and the source. The number of control electrodes 4 is equal to the number of the in-parallel connected adjustable resistors 11, and the control electrodes 4 and the adjustable resistors 11 are in one-to-one correspondence to each other.

In the step S15, for each of the adjustable resistors connected in parallel between the gate and the source, a post-intersection metal wire is formed after a metal wire of the gate contact hole of the adjustable resistor intersects a metal wire of the control electrode of the adjustable resistor, the post-intersection metal wire is configured to connect with the gate metal wire, the pattern of the control electrodes 4 of the adjustable resistors connected in parallel between the gate and the source is configured to enable the post-intersection metal wire to have a width in a range of 2 um.

In a step S16, a passivation layer 20 is deposited; and a metal contact region of the source 5, a metal contact region of the gate 6, and contact regions of the control electrodes 4 of the adjustable resistors connected in parallel between the gate 6 and the source 5 are defined by performing the photolithography process and using the photoresist.

The metal contact region of the source 5, the metal contact region of the gate 6, and the contact regions of the control electrodes 4 of the adjustable resistors connected in parallel between the gate 6 and the source 5 are obtained by performing dry etching. The number of contact regions of the control electrodes 4 is equal to the number of adjustable resistors 11 connected in parallel between the gate 6 and the source 5; and the contact regions of the control electrodes 4 and the adjustable resistors 11 are in one-to-one correspondence with each other. The passivation layer 20 is silicon dioxide.

Lastly, a super-junction power device having the adjustable resistors connected in parallel between the gate and the source is obtained.

In the present disclosure, the additional resistors are not required to be connected in parallel between the gate and the source in a circuit, and therefore, manufacturing costs are reduced, integration and stability of the super-junction power device is improved. Furthermore, changes in a gate pattern, contact holes, and a metal wire layer, caused by different resistors in-parallel connected between different gates and sources having different application requirements, may be avoided, a mask plate may not be re-made, manufacturing costs are reduced. The control electrode is arranged to perform on-circuit control individually on each resistor in-parallel connected between one gate and one source to adjust the resistance value of each resistor. Versatility of the super-junction power device is improved.

It is apparent to any ordinary skilled person in the art that the present disclosure is not limited to the details of the above exemplary embodiments. The present disclosure can be achieved in other specific forms without departing from the spirit or essential features of the present disclosure. Accordingly, the embodiments shall be exemplary and do not limit the present disclosure. The scope of the present disclosure is limited by the appended claims and not by the foregoing description. Therefore, all variations falling within the meaning and scope of the equivalent elements of the claims shall be covered by the present disclosure. Any reference numerals in the claims should not be regarded as limiting the claims.

In addition, it should be understood that although the present specification is described in accordance with the embodiments, it shall not be interpreted as each embodiment containing only one independent technical solution. The description of the specification is only for clarity. Any ordinary skilled person in the art shall take the specification as a whole, and the technical solutions in the embodiments shall be combined appropriately to form other embodiments that can be understood by any ordinary skilled person in the art.

What is claimed is:

1. A method of manufacturing a super-junction power device having adjustable resistors connected in parallel between gates and sources, wherein the gates and the sources are in one-to-one correspondence with each other, and more than one adjustable resistors are connected in parallel between each of the gates and the corresponding one of the sources, the method comprising:

a step A: preparing a unit cell and the adjustable resistors connected in parallel between the source and the gate of the super-junction power device;

a step B: preparing contact holes;

a step C: preparing metal wires; and a step D: preparing a passivation layer;

wherein the step A comprises:

a step S1: depositing, by performing chemical vapor deposition, an intrinsic epitaxial layer on an upper surface of a silicon substrate; doping pentavalent elements, by ion implantation, into the intrinsic epitaxial layer;

a step S2: depositing a first mask on an upper surface of the intrinsic epitaxial layer, wherein the first mask is photoresist or a multilayer structure of the photoresist combined with at least one insulating mask;

a step S3: defining, by performing a photolithographic process, a pattern of columnar doping regions on the first mask to form the columnar doping regions; doping, by ion implantation, trivalent elements into the intrinsic epitaxial layer; removing the first mask by dry etching and wet etching;

a step S4: repeating the step S1, the step S2, and the step S3 until a total thickness of the intrinsic epitaxial layer is in a range of 30 um to 70 um;

a step S5: growing a gate oxide layer by performing a thermal oxidation step; obtaining a doped gate polysilicon by low-pressure chemical vapor deposition;

a step S6:

depositing a second mask on the gate polysilicon, wherein the second mask is photoresist or a multilayer structure of the photoresist combining with at least one insulating mask;

defining a first gate pattern on the second mask by performing a photolithographic process, forming the gates by dry etching; removing the second mask by dry etching and wet etching;

defining a second gate pattern of a field effect transistor of metal oxides of the unit cell and a pattern of the adjustable resistors connected in parallel between the gate and the source, wherein a resistance value of the adjustable resistors connected in parallel connected between the gate and the source is adjustable within a range from 5 kOhms to 20 kOhms;

wherein an adjustment of the resistance value of the adjustable resistors is achieved by defining the pattern of the adjustable resistors connected in parallel to have a width of 1-10 um, and providing two to five adjustable resistors connected in parallel between one gate and one source, a step S7: obtaining body regions by implanting first impurities into the upper surface of the intrinsic epitaxial layer, wherein the first impurities comprise the trivalent elements; implanting the first impurities into the polysilicon; activating the first impurities in the body regions by performing a thermal process;

a step S8:

depositing a third mask on the upper surface of the intrinsic epitaxial layer, wherein the third mask is photoresist or a multilayer structure of the photoresist combining with at least one insulating mask;

defining a pattern of source regions on the third mask by performing a photolithography process; obtaining the source regions by implanting second impurities into an upper surface of each of the body regions; wherein the second impurities comprise the pentavalent elements;

blocking, by the third mask, a polysilicon resistor from being doped by the second impurities; removing the third mask by dry etching and wet etching;

activating the second impurities in the source regions by performing a thermal process; and a step S9: obtaining highly-doped ohmic contact regions by implanting the trivalent elements to the upper surface of the intrinsic epitaxial layer; implanting the trivalent elements into the polysilicon resistor to obtain the unit cell and the adjustable resistors connected in parallel between the gate and the source.

2. The method according to claim 1, wherein the trivalent elements in the step S3, the step S7, and the step S9 include boron; and the pentavalent elements in the step S1, and the step S8 are selected from arsenic and phosphorus.

3. The method according to claim 1, wherein processing conditions of implanting the trivalent elements and the pentavalent elements are independently defined for each repetition of the steps S1-S3 in the step S4.

4. The method according to claim 1, wherein a thickness of the gate oxide layer in the step S5 is in a range of 50 nm to 200 nm, and a thickness of the gate polysilicon in the step S5 is in a range of 500 nm to 1000 nm.

5. The method according to claim 1, wherein the step B comprises:

a step S10: forming a silicon dioxide dielectric layer by chemical vapor deposition;

a step S11: defining a pattern of contact holes of the source regions, a pattern of a contact hole of a gate region, a pattern of gate contact holes and a pattern of source contact holes of the adjustable resistors connected in parallel between the gate and the source;

wherein the pattern of the contact holes of the source regions is located above the source regions and the body regions and is configured to lead out both the source regions and the body regions; the pattern of the contact hole of the gate region is located above the gate polysilicon; gate metal wires are arranged in a partial region of the source regions without the contact holes of the source regions; the gate contact holes and the source contact holes of the adjustable resistors connected in parallel between the gate and the source are located above the adjustable resistors connected in parallel between the gate and the source and are configured to allow the gate and the source to be in-parallel connected to the adjustable resistors;

a step S12: obtaining the contact holes of the source regions, the contact hole of the gate region, and the gate contact holes and the source contact holes of the adjustable resistors connected in parallel between the gate and the source by dry etching the silicon dioxide dielectric layer;

a step S13: depositing, by performing physical vapor deposition, a metal layer to serve as an adhesive layer; depositing, by performing physical vapor deposition, metal nitride to serve as a barrier layer; forming silicide by performing a rapid thermal degradation process, wherein the metal comprises one or more of: titanium, cobalt, and tantalum; and a step S14: depositing, by performing a tungsten bolt process, tungsten metal; removing, by performing dry etching, any tungsten metal located outside the contact holes to form the tungsten bolt in each of the contact holes of the source regions, the contact hole of the gate region, and each of the contact holes of the adjustable resistors connected in parallel between the gate and the source.

6. The method according to claim 5, wherein the step C comprises:

a step S15:

depositing, by performing physical vapor deposition, an aluminum-copper compound above the tungsten bolt;

defining, by performing a photolithography process and using the photoresist, a metal wire pattern of the source, a metal wire gate pattern, a pattern of control electrodes of the adjustable resistors connected in parallel between the gate and the source;

obtaining, by performing dry etching, the source, the gate, and the control electrodes of the adjustable resistors connected in parallel between the gate and the source, wherein the metal wire pattern of the source is located above the source regions;

arranging the metal wire gate pattern to surround an edge of the unit cell to connect the gate, through the contact hole of the gate region, to the partial region of the source regions without the contact holes of the source regions to form the gate metal wires;

wherein the pattern of the control electrodes of the adjustable resistors connected in parallel between the gate and the source is connected, through the gate contact hole, to each of the adjustable resistors connected in parallel between the gate and the source; one control electrode is led out from a region between the gate metal wires and one adjustable resistor connected in parallel between the gate and the source; the number of control electrodes is equal to the number of the in-parallel connected adjustable resistors.

7. The method according to claim 6, wherein in the step S15, a post-intersection metal wire is formed after a metal wire of the gate contact hole of the adjustable resistors intersects a metal wire of the control electrode of the adjustable resistors, the post-intersection metal wire is configured to connect with the gate metal wire, the pattern of the control electrode of the adjustable resistors connected in parallel between the gate and the source is configured to enable the post-intersection metal wire to have a width in a range of 1 um to 2 um.

8. The method according to claim 6, wherein, the step D comprises:

a step S16:

depositing a passivation layer, defining, by performing a photolithography process and using the photoresist, a metal contact region of the source, a metal contact region of the gate, and contact regions of the control electrodes of the adjustable resistors connected in parallel between the gate and the source; and obtaining, by performing dry etching, the metal contact region of the source, the metal contact region of the gate, and the contact regions of the control electrodes of the adjustable resistors connected in parallel between the gate and the source;

wherein the number of the contact regions of the control electrodes is equal to the number of adjustable resistors connected in parallel between the gate and the source, and the contact regions of the control electrodes and the adjustable resistors connected in parallel between the gate and the source are in one-to-one correspondence with each other; and the passivation layer is silicon nitride or silicon dioxide.

9. A super-junction power device having adjustable resistors connected in parallel between a gate and a source, obtained by performing the manufacturing method according to claim 1.

* * * * *